United States Patent
Wang et al.

(10) Patent No.: US 7,750,696 B2
(45) Date of Patent: Jul. 6, 2010

(54) PHASE-LOCKED LOOP

(75) Inventors: Yanbo Wang, Shanghai (CN); Xiaoqian Zhang, Shanghai (CN); Shubing Zhai, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 70 days.

(21) Appl. No.: 12/077,929

(22) Filed: Mar. 20, 2008

(65) Prior Publication Data

US 2009/0237132 A1    Sep. 24, 2009

(51) Int. Cl.
*H03L 7/06* (2006.01)
(52) U.S. Cl. .................. 327/156; 327/149; 327/147
(58) Field of Classification Search ............ None
See application file for complete search history.

(56) References Cited

U.S. PATENT DOCUMENTS

| 6,856,180 | B1 * | 2/2005 | Starr et al. | 327/147 |
| 6,947,514 | B1 * | 9/2005 | Kato et al. | 375/376 |
| 2007/0194818 | A1 * | 8/2007 | Kim et al. | 327/156 |
| 2009/0237128 | A1 * | 9/2009 | Qiao | 327/117 |
| 2010/0001771 | A1 * | 1/2010 | Liu et al. | 327/157 |

* cited by examiner

*Primary Examiner*—Tuan Lam
*Assistant Examiner*—Hiep Nguyen
(74) *Attorney, Agent, or Firm*—Hayes and Boone LLP

(57) ABSTRACT

A method of calibrating a PLL that includes forcing a control voltage input to a voltage controlled oscillator to be a reference voltage and setting a calibration divider coupled to receive an output clock signal from the voltage controlled oscillator such that the calibration divider utilizes one of a plurality of divisors that results in the output clock signal having a high frequency can substantially avoid overshoot and glitch problems associated with conventional PLL calibrations.

18 Claims, 5 Drawing Sheets

PHASE-LOCKED LOOP

BACKGROUND

1. Technical Field

The present invention relates to phase-locked loop calibration and, in particular, to phase-locked loop calibration that reduces glitch and overshoot.

2. Discussion of Related Art

Phase-Locked Loops (PLLs) find application in various contexts where a stable, often high frequency, clock signal is desired. Applications of PLLs include, for example, clock generation for CPUs and for telecommunications. Often, PLLs utilize a calibration procedure to improve the performance of the PLL. Calibration may be especially important for PLLs with large tuning ranges.

During calibration, the output signal frequency of the PLL is adjusted to a particular response to an input reference clock. During calibration code jumps, where the frequency adjustment of the PLL output signal is made, the output clock signal from the PLL may experience overshoot or glitch. If this clock signal is then used as the system clock in a particular chip, the overshoot or glitch can induce computational error or even system failure.

Overshoot usually occurs during a frequency ascending code jumping portion of the calibration procedure. During the calibration process of jumping from a calibration code that results in a low frequency output clock signal to a calibration code that results in a high frequency output clock signal, the PLL output clock signal may be momentarily at a higher frequency than the system can accommodate, so overshoot occurs. In some cases, a frequency descending code can be utilized during the calibration procedure to avoid overshoot because the frequency then changes from high frequency to low frequency clock signals during the calibration process. However, even a frequency descending code sequence has a risk of overshoot if a calibration process is needed at any moment during a work state, which happens, for example, if the input reference clock to the PLL changes suddenly. In a descending frequency calibration sequence, the calibration code jumps from the current code to the highest frequency code in order to start the descending code sequence. During the initial transition to the calibration code resulting in the highest frequency output clock signal, overshoot may occur.

Glitch can also occur during calibration code jumps. Usually, the calibration acts on delay cells of a voltage-controlled oscillator (VCO) of the PLL (e.g. by switching the capacitances on delay cells). During switching, the switch noise can induce glitch, especially for a single end VCO.

Therefore, there is a need for a calibration for phase-locked-loops that reduces or avoids glitch or overshoot.

SUMMARY

A method of calibrating a phase-locked loop (PLL) according to some embodiments of the present invention includes forcing a control voltage that is input to a voltage controlled oscillator to be a reference voltage; setting a calibration divider that is coupled to receive an output clock signal from the voltage controlled oscillator to a low division divisor, the low division divisor being one of a plurality of divisors; allowing the control voltage to be adjusted until the PLL stabilizes; and adjusting the calibration divider to utilize another of the plurality of divisors if a completion condition is not met. The completion condition can include that the control voltage exceeds the reference voltage or that all of the divisors in the calibration divider have been tested.

A PLL according to some embodiments of the present invention can include a voltage controlled oscillator that generates an output clock signal in response to a control voltage; a controller that generates the control voltage in response to a phase difference between a reference clock signal and a feedback clock signal; a feedback circuit that generates the feedback clock signal in response to a PLL output clock signal; a calibration divider that includes a plurality of divisors, the calibration divider coupled to receive the output clock signal and to generate the PLL output clock signal in response to a divider code that determines which of the plurality of divisors to utilize; a reference voltage regulator coupled to receive a reference voltage and to force the control voltage to the reference voltage upon receipt of a force signal; and a calibration circuit coupled to provide the force signal to the reference voltage regulator and the divider code to the calibration divider.

These and other embodiments will be described in further detail below with respect to the following figures.

Figure 1:
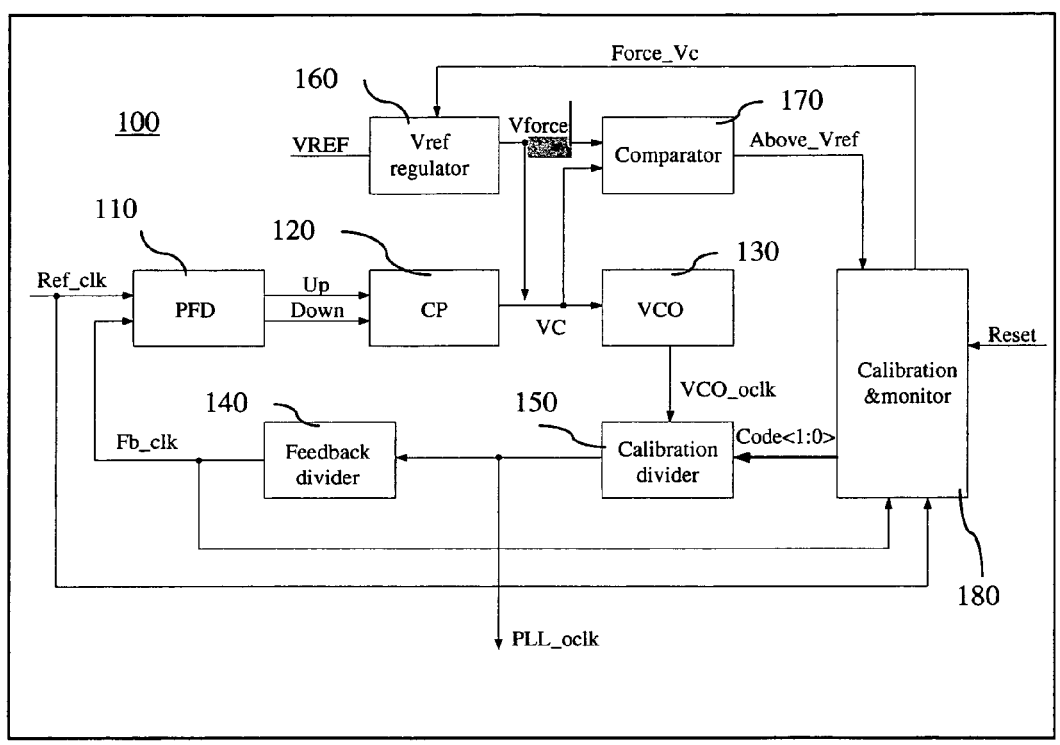
FIG. 1 shows a block diagram of a phase-locked-loop (PLL) according to some embodiments of the present invention.

In the drawings, elements having the same designation have the same or similar functions.

DETAILED DESCRIPTION

In the following description specific details are set forth describing certain embodiments of the invention. It will be apparent, however, to one skilled in the art that the present invention may be practiced without some or all of these specific details. The specific embodiments presented are meant to be illustrative of the present invention, but not limiting. One skilled in the art may realize other material that, although not specifically described herein, is within the scope and spirit of this disclosure.

In accordance with aspects of the present invention, an improved method of providing a system clock that reduces or avoids glitch or overshoot during PLL calibration is presented. In a PLL according to some embodiments of the present invention, a calibration divider replaces the switch capacitors that are conventionally utilized in the delay cells of a PLL. The calibration divider according to some embodiments of the present invention can include several divisors, the number of which is defined by requirements of the system utilizing the PLL. A calibration process involves selecting the correct divisor among the several divisors, a process which substitutes for switching capacitors in the conventional delay cells. In order to switch among the several divisors without glitch, the output frequency of the PLL should be low. The calibration divider, then, switches from high frequency clocking to low frequency clocking until the correct divisor is found. In addition, the control voltage to the voltage-controlled oscillator (VCO) can be forced to a low voltage before re-calibration, which can substantially solve the overshoot problem when switching divisors to the high frequency divisor.

Each time the PLL needs calibration, the VCO control voltage is first forced to a low voltage, which sets the PLL output signal to operate at a low frequency. Because the frequency is low, a calibration divider can smoothly switch the divisor from one divisor to another divisor while avoiding glitch. Forcing the VCO control voltage low can avoid the risk of overshoot before re-calibration because by pulling the control voltage of the VCO down to a low voltage, the PLL frequency becomes low and the calibration code can jump to the highest frequency code without substantial risk of overshoot.

The calibration process can then utilize a frequency descending code to avoid overshoot. By using a frequency descending code and forced low VCO control voltage, the PLL can provide a clock signal during calibration with substantially no glitch or overshoot.

FIG. 1 shows a block diagram of a PLL 100 according to some embodiments of the present invention. As shown in FIG. 1, PLL 100 includes a phase difference detector (PFD) 110, a charge pump (CP) 120, a voltage-controlled oscillator (VCO) 130, a feedback divider 140, a calibration divider 150, a reference voltage (VREF) regulator 160, a comparator 170, and a calibration and monitor block 180. As shown in FIG. 1, PFD 110 compares the phase of a reference clock (REF_clk) and a feedback clock (FB_clk) and provides an up or down instruction to CP 120 to increase or decrease the control voltage (VC) to VCO 130. VCO 130 produces a VCO output clock (VCO_oclk) signal based on the control voltage (VC). The output clock signal VCO_oclk is input to calibration divider 150. The output signal from calibration divider 150 is the PLL output clock (PLL_oclk), which is also input to feedback divider 140. Feedback divider 140 divides the PLL_oclk signal to produce the feedback clock signal (Fb_clk).

A calibration function according to some embodiments of the present invention is controlled by calibration and monitor block 180. Calibration and monitor block 180 receives as inputs the reference clock signal Ref_clk, the feedback clock signal Fb_clk, and a signal Above_Vref from comparator 150. Calibration and monitor block 180 then controls calibration divider 150 and VREF regulator 160. Calibration and monitor block 180 is the control module for calibration procedures and determines whether PLL 100 needs calibration. Calibration and monitor block 180 calibrates PLL 100 by adjusting a divider code to calibration divider 150, which indicates which divisor included in calibration divider 150 to utilize. Calibration and monitor block 180, for example, calibrates PLL 100 on chip start-up or when a sudden change in the reference clock Ref_clk occurs such that the reference clock Ref_clk is no longer substantially equal to the feedback clock Fb_clk that is detected by block 180.

VREF regulator 160 provides a force voltage Vforce based on an input reference voltage VREF when directed by a force signal Force_VC from calibration and monitor block 180. In some embodiments, when signal Force_Vc becomes active, VREF regulator 160 will force the control voltage (VC) to VREF. Input reference voltage VREF is a low voltage, which when applied to VCO 130 causes VCO 130 to produce a low frequency output signal VCO_oclk. Calibration and monitor block 180 activates the force signal Force_Vc signal when it begins a calibration process. In some embodiments, the force voltage Vforce is regulated to be equal to the voltage VREF in VREF regulator 160.

Comparator 170 compares the control voltage VC, which at the beginning of a calibration operation will be forced to the reference voltage VREF, with the regulated reference voltage Force_Vc, which in embodiments such as that shown in FIG. 1 is voltage VREF. The logic state of the output signal (Above_Vref) from comparator 170 depends on whether the control voltage VC is greater or lower than the reference voltage VREF. During calibration, the divider code will be set such that calibration divider 150 chooses the divisor that yields the highest frequency output signal VCO_oclk from VCO 130 and then increments to choose a different divisor every calibration cycle (which depends on the time required for PLL 100 to stabilize after adjustment has been made to the divider code) until a divisor is found where control voltage VC is higher than signal VREF, or until all of the divisors have been tested.

In some embodiments, calibration divider 150 is the only active module in the feedback loop of PLL 100. The feedback loop of PLL 100 includes calibration divider 150 and feedback divider 140. Calibration divider 150 can include any number of divisors and selects the divisor based on the divider code received from calibration and monitor block 180. In some embodiments of the invention, calibration divider 150 can include four (4) divisors, in which case the divider code can be a two-bit digital code.

Figure 2:
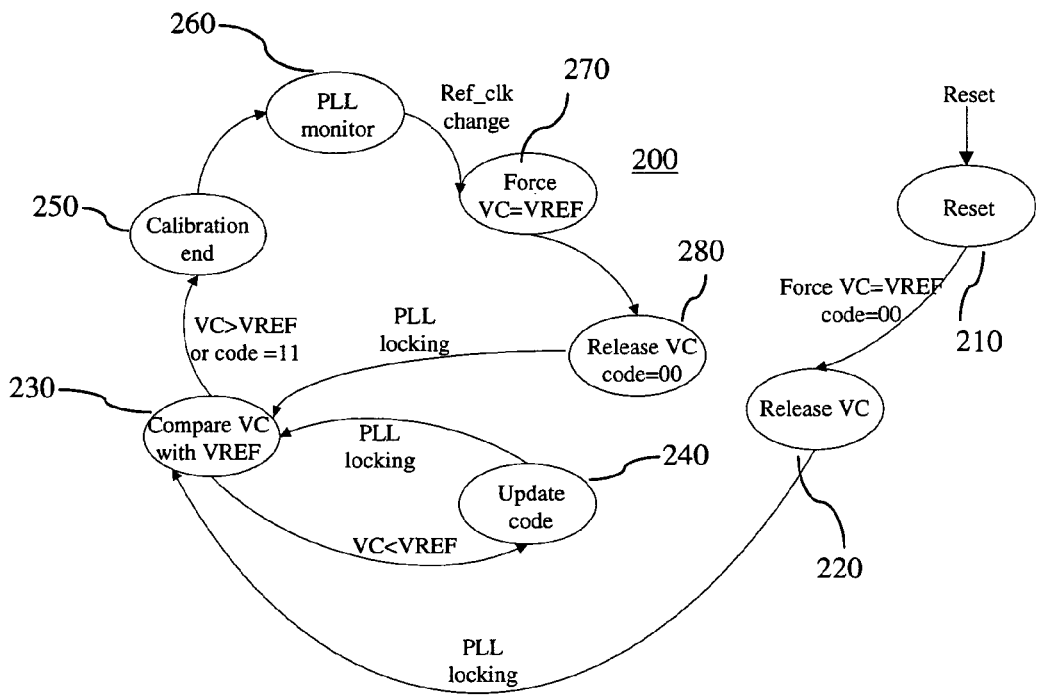
FIG. 2 shows a calibration state machine for calibration of the PLL shown in FIG. 1.

FIG. 2 shows an example calibration state machine 200 according to some embodiments of the present invention. State machine 200 illustrates details of the calibration procedure from reset to re-calibration.

On chip power up, a Reset signal is asserted and state machine 200 enters reset state 210. As shown in FIG. 1, upon receipt of an asserted signal Reset in reset state 210, calibration and monitor block 180 asserts the signal Force VC and VREF regulator 160 forces voltage control signal VC to reference voltage VREF. PLL 100 then functions at a low frequency output clock signal VCO_oclk. During reset state 210, calibration and monitor block 180 sets the divider code to the highest frequency code, which for purposes of the present discussion will be considered to be default code "00". In response to the divider code "00", calibration divider 150 is set to divide by the lowest amount, which in some embodiments can be one.

When the Reset signal returns to an un-asserted state, state machine 200 proceeds to release VC state 220. During release VC state 220, calibration and monitor block 180 de-asserts the signal Force_VC to VREF regulator 160 and the voltage control signal VC is released, allowing PLL 100 to begin to lock. After PLL 100 becomes stable, state machine 200 enters the compare state 230. In some embodiments, a counter may be utilized to determine a set time after PLL 100 begins to lock in order to determine when PLL 100 becomes stable.

In compare state 230, calibration and monitor block 180 monitors the Above_VREF signal from comparator 170. If voltage control signal VC is lower than VREF, the frequency of output clock signal VCO_oclk from VCO 130 is low and calibration divider 150 needs to be tuned to increase the frequency of signal VCO_oclk. State machine 200 then transitions to update code state 240 where calibration and monitor block 180 updates the divider code by incrementing the code by 1 (i.e., choosing the next divisor). When PLL 100 is again stable, state machine 200 transitions back to compare state 230. Transitioning between compare state 230 and update code state 240 continues until either the control voltage VC becomes higher than reference voltage VREF or the divider code is full (i.e., the last divisor has been chosen, which can be divider code "11"), at which point state machine 200 transitions to calibration end 250. At calibration end 250, the reset calibration phase is complete. Calibration end 250 then sends a lock signal to the PLL monitor and transitions to PLL monitor state 260.

While state machine 200 is in PLL monitor state 260, calibration and monitor block 180 monitors the reference clock signal Ref_clk and compares its frequency with that of the feedback clock signal Fb_clk. When the reference clock changes frequency suddenly, the reference clock signal Ref_clk no longer has a frequency that is substantially equal to that of the feedback clock signal Fb_clk. When this situation is detected by calibration and monitor block 180 in monitor state 260, state machine 200 begins a re-calibration process by transitioning to force state 270. A change in the reference clock can be detected by comparing counters on the reference clock and the feedback clock. If they differ by a set amount, then state machine 200 recalibrates by transitioning to force state 270. In some embodiments, a 10000 count threshold is set, which indicates a 1% change in the clock frequency.

During force state 270, calibration and monitor block 180 activates the signal Force_VC so that VREF regulator 160 forces control voltage VC to the reference voltage VREF. Once the control voltage VC has been forced to the reference voltage VREF by VREF regulator 160 in force state 270, state machine 200 transitions to release state 280. In release state 280, the divider code is reset to its highest frequency code (e.g., code "00") and the control voltage VC is released. Once PLL 100 is stable, state machine 200 transitions to compare state 230. From compare state 230, state machine 200 transitions between compare state 230 and update state 240 as described above. As discussed above, in compare state 230 comparator 170 compares control voltage VC with reference voltage VREF and provides an output signal Above_Vref to calibration and monitor block 180 when control voltage VC is greater than reference voltage VREF or the divider code is full. State machine 200 then transitions to calibration end state 250 and then monitor state 260, ending the recalibration sequence for PLL 100.

As discussed above, calibration divider 150 can include any number of divisors. The divider code then includes a number of bits sufficient to identify each of the divisors. Further, each of the divisors can divide the frequency of the VCO output signal VCO_oclk by any amount such that the divisors have a sequence from low divisors (corresponding to high frequency output signals) to high divisors (corresponding to low frequency output signals). As a particular example, calibration divider 150 can include four divisors corresponding to a divide-by-one, a divide-by-two, a divide-by-four, and a divide-by-eight divisor. The divider code can then include two bits with code "00" selecting the divide-by-one divisor, code "01" selecting the divide-by-two divisor, "10" selecting the divide-by-four divisor, and "11" selecting the divide-by-eight divisor.

Figure 3:
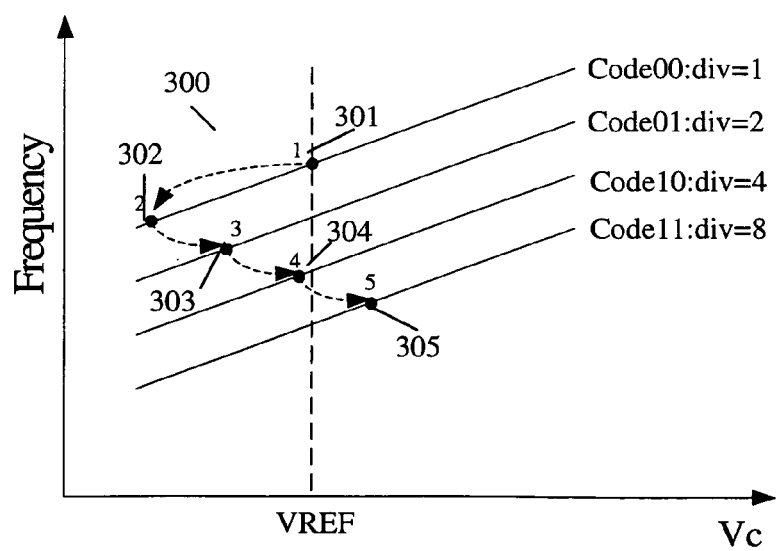
FIG. 3 illustrates an example calibration flow from the reset state to the end of calibration state shown in the state machine illustrated in FIG. 2.

FIG. 3 illustrates an example calibration flow 300 from reset state 210 of state machine 200 to calibration end state 250 in the four-divisor embodiment described above. In the example shown in FIG. 3, after control voltage VC is released in release state 220, PLL 100 transitions from point 301 (where control voltage VC is forced to reference voltage VREF and the code is set to "00" for a divide-by-1 divisor) to stabilize at point 302. The PLL locking process, then, is represented from point 301 to point 302 of FIG. 3. The reference clock in this diagram, therefore, is at low frequency and compare state 230 transitions to update code state 240 where the divider code Code<1:0> is changed from "00" to "01". Calibration divider 150 changes divisors from a divide-by-1 divisor to a divide-by-2 divisor. Because the frequency of the VCO output clock VCO_oclk is very low, the divisors in calibration divider 150 can be switched so that there is no glitch. As shown in the example of FIG. 3, the control voltage VC then transitions from point 302 to stabilize at point 303.

Again, the requirements for transition to calibration end state 250 are not satisfied at point 303 and compare state 230 transitions to update code state 240, where the divider code Code<1:0> is incremented to "10". Calibration divider 150 then switches to a divide-by-4 divisor from a divide-by-2 divisor. The control voltage VC then transitions from point 303 to stabilize at point 304.

In the example shown in FIG. 3, the conditions for completion are not met until point 305, where both criteria for completion—control voltage VC is greater than reference voltage VREF and the divider code is full (i.e. at code "11")—are met. Therefore, state machine 200 transitions between compare 230 and update code state 240 through point 304 and finally to point 305, where state machine 200 then transitions to calibration end 250. The code is incremented from Code <1:0>="10" where PLL 100 stabilizes at point 304 to Code<1:0>="11" where PLL stabilizes at point 305. In the example shown here, calibration divider 150 is set to a divide-by-4 divisor for Code <1:0>="10" and a divide-by-8 divisor for Code <1:0>="11". Because the divider switches from divide-by-1 to divide-by-8 in turn, the calibration process is substantially glitch free.

Figure 4:
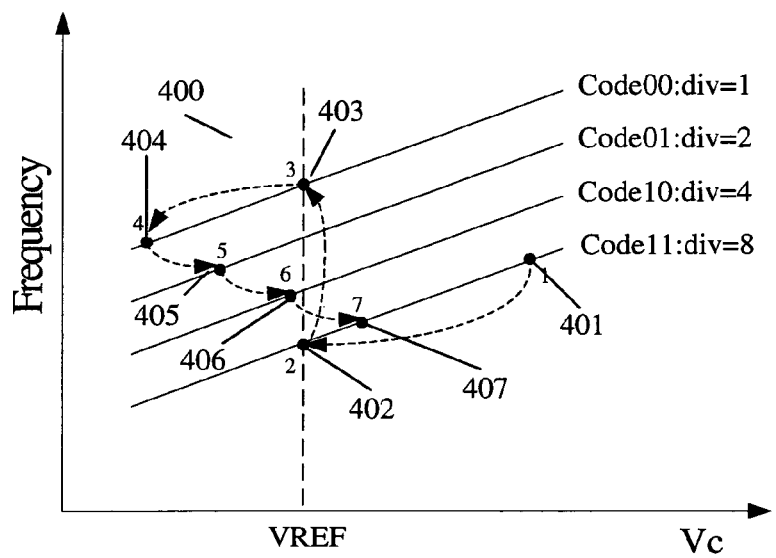
FIG. 4 illustrates an example calibration flow from a re-calibration state to the end of calibration state shown in the state machine illustrated in FIG. 2.

FIG. 4 illustrates an example recalibration flow 400 according to some embodiments of the present invention. If the reference clock Ref_clk changes suddenly, as detected in PLL monitor state 260 of state machine 200, state machine 200 will begin a recalibration sequence by transitioning to force state 270. As shown in FIG. 4, calibration and monitor block 180 detects that the reference clock Ref_clk has changed suddenly at point 401 and forces the control voltage VC to be the reference voltage VREF, moving to point 402. As described above, once control voltage VC has been forced to reference voltage VREF in force state 270, state machine 200 transitions to release 280 where divider code Code <1:0> is set to code "00" (the highest frequency divisor). At that point, PLL 100 transitions to point 403 in flow 400 shown in FIG. 4. Because the VCO output clock VCO_oclk is low, divider code Code<1:0> can be changed from "11" to "00" smoothly without glitch or overshoot. If the process is transitioned from point 401 to point 403 directly with the VCO output clock VC_oclk still at high frequency, both glitch and overshoot can result. When the code is changed from "11" to "00" at point 401 without driving control voltage VC to a low voltage, it is likely that the PLL output clock PLL_oclk is switched to a high frequency clock that will be higher than the maximum frequency, resulting in overshoot. At the same time, if calibration divider 150 switches divisors while VCO is outputting a frequency clock signal, glitch may be generated. By tuning flow 400 as illustrated in FIG. 4 and state machine 200 as illustrated in FIG. 2, PLL 100 can provide a clean output clock for the system without glitch or overshoot.

From point 403 in FIG. 4, state machine 200 transitions between compare state 230 and update code state 240 until the conditions for completion are met, in which case state machine 200 transitions to calibration end state 250. In the particular example shown in FIG. 4, PLL 100 stabilizes at point 404 with code="00", stabilizes at point 405 with code="01", stabilizes at point 406 with code="10", and stabilizes at point 407 with code="11". The conditions for calibration end state 250 are met at point 407.

Figure 5:
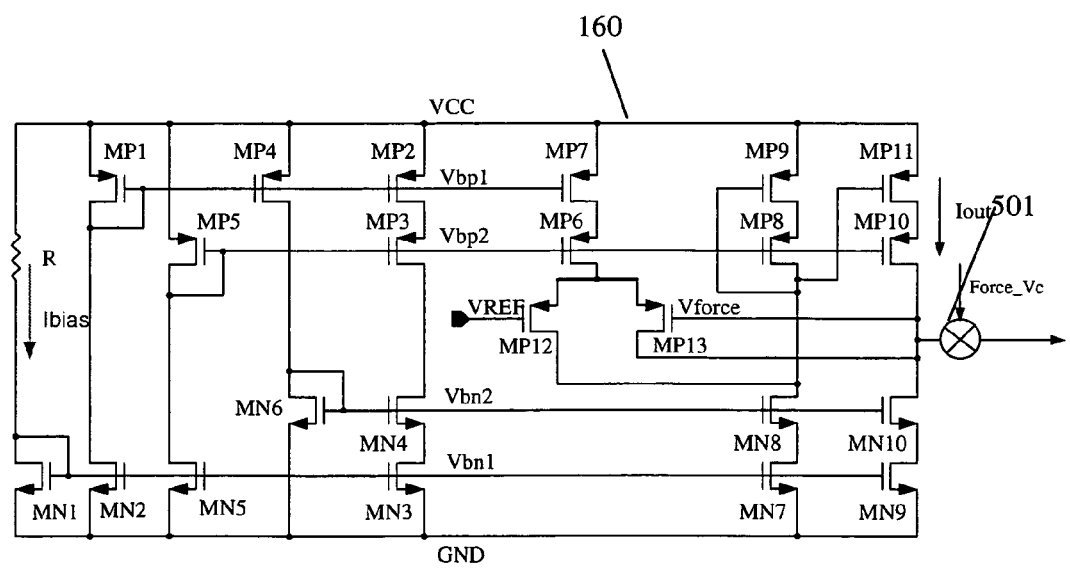
FIG. 5 shows a schematic diagram of a reference voltage regulator that can be utilized in the PLL illustrated in FIG. 1.

FIG. 5 shows an example of VREF regulator 160 according to some embodiments of the present invention. As shown in FIG. 5, VREF regulator 160 forces voltage Vforce to be equal to reference voltage VREF. The embodiment shown in FIG. 5 a unit gain buffer that drives VC to VREF when the Force_VC signal is active. When Force_VC is active, driver 501 is activated and voltage Vforce will pull control voltage VC to be equal to reference voltage VREF. Usually control voltage VC is connected at a large capacitance, which is incrementally charged or discharged by CP 120. In order to quickly pull the control voltage VC, drive current Iout of VREF regulator 160 should be a large current, at least larger than the current from CP 120, in order to charge or discharge the capacitor in CP 120. The current Iout through MP11 is mirrored from the self-bias current Ibias that is created through MN1 and resistor R. Transistors MN2, MN3, MN5, MN6, MP1, MP2, MP4, MP5 generate bias voltages vbp1, vbp2, vbn1, vbn2, which drive the source and sink currents of the cascade operational amplifier formed by transistors MP6, MP7, MP8, MP9, MP10, MP11, MP12, MP13, MN7, MN8, MN9, and MN10. In some embodiments, the cascade operational amplifier of VREF regulator 160 shown in FIG. 5 has a gain that is large enough to make sure that the output voltage (Vforce) is held equal to input voltage (VREF) in a closed loop.

Figure 6:
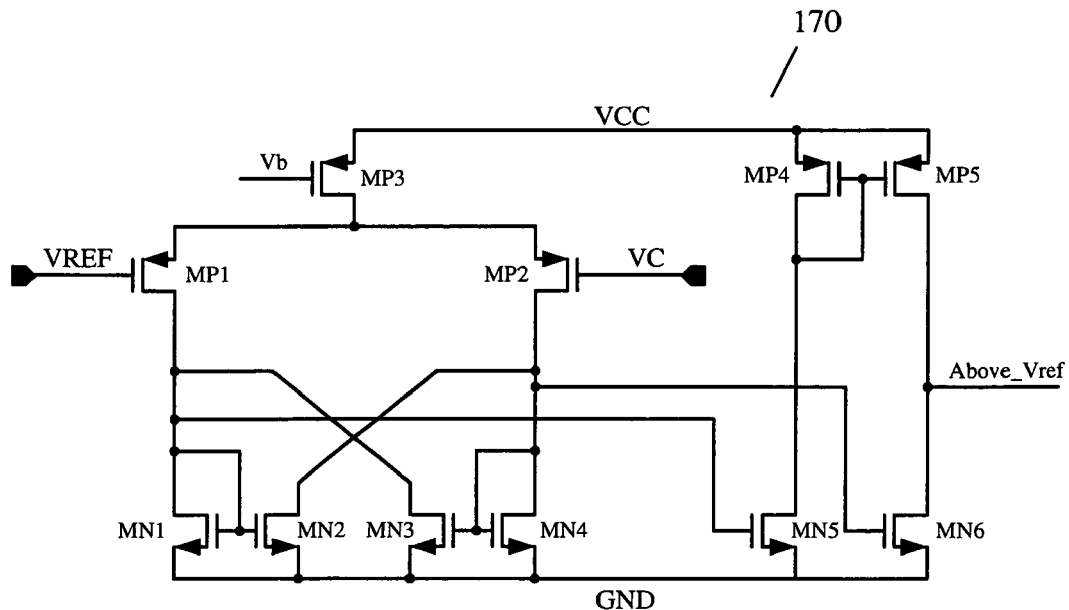
FIG. 6 shows a schematic diagram of a comparator circuit that can be utilized in the PLL illustrated in FIG. 1.

FIG. 6 shows an example circuit diagram for comparator 170, which compares control voltage VC with reference voltage VREF, according to some embodiments of the present invention. The embodiment of comparator 170 includes a comparator circuit formed by a differential input stage that includes transistors MP1, MP2, MN1 and MN4, a current sink formed by transistor MP3, and an output stage formed by transistors MP4, MP5, MN5 and MN6. If control voltage VC is higher than reference voltage VREF, the signal Above_Vref becomes high. This is an indication that the VCO output clock signal VCO_oclk is at high frequency and PLL 100 does not need calibration. If control voltage VC is lower than reference voltage VREF, the signal Above_Vref becomes low indicating that PLL 100 should be further calibrated, until voltage VC is larger than voltage VREF. During calibration, control voltage VC may be the same as reference voltage VREF. In order to avoid an indeterminate Above_Vref signal due to noise, the embodiment of comparator 170 shown in FIG. 6 includes hysteresis, as implemented with transistors MN2 and MN3.

FIG. 5 shows an example of VREF regulator 160 according to some embodiments of the present invention. As shown in FIG. 5, VREF regulator 160 forces voltage Vforce to be equal to reference voltage VREF. The embodiment shown in FIG. 5 is a unit gain buffer that drives VC to VREF when the Force-VC signal is active. When Force-VC is active, driver 501 is activated and voltage Vforce will pull control voltage VC to be equal to reference voltage VREF. Usually control voltage VC is connected at a large capacitance, which is incrementally charged or discharged by CP 120. In order to quickly pull the control voltage VC, drive current 1out of VREF regulator 160 should be a large current, at least larger than the current from CP 120, in order to charge or discharge the capacitor in CP 120. The current Iout through MP11 is mirrored from the self-bias current Ibias that is created through MN1 and resistor R. Transistors MN2, MN3, MN5, MN6, MP1, MP2, MP4, MP5 generate bias voltages vbp1, vbp2, vbn1, vbn2, which drive the source and sink currents of the cascade operational amplifier formed by transistors MP6, MP7, MP8, MP9, MP10, MP11, MP12, MP13, MN7, MN8, MN9, and MN10. In some embodiments, the cascade operational amplifier of VREF regulator 160 shown in FIG. 5 has a gain that is large enough to make sure that the output voltage (Vforce) is held equal to input voltage (VREF) in a closed loop.

Figure 7:
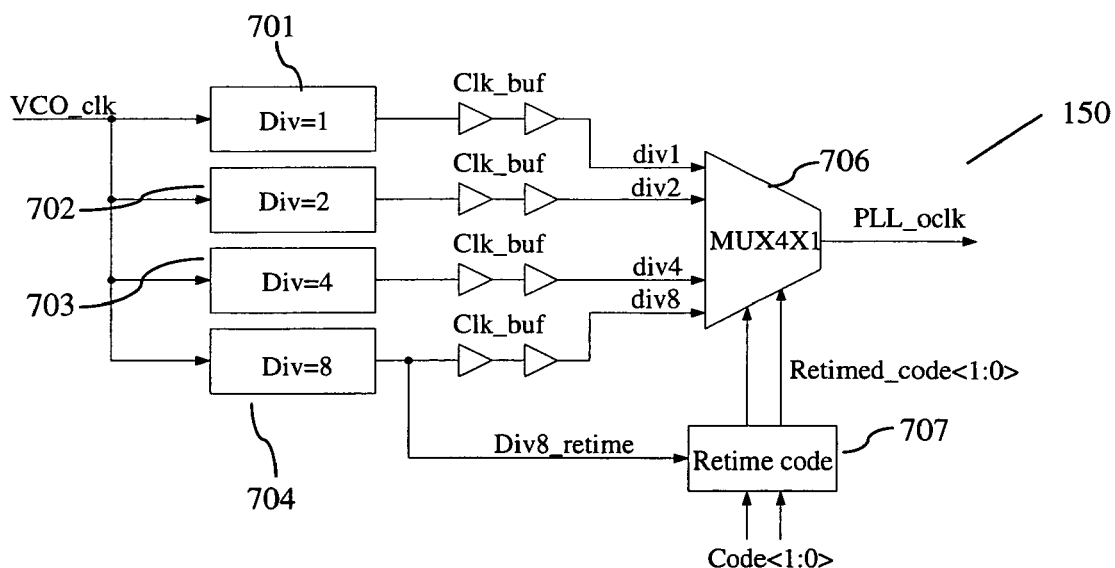
FIG. 7 shows a schematic diagram of a calibration divider that can be utilized in the PLL illustrated in FIG. 1.
Figure 8:
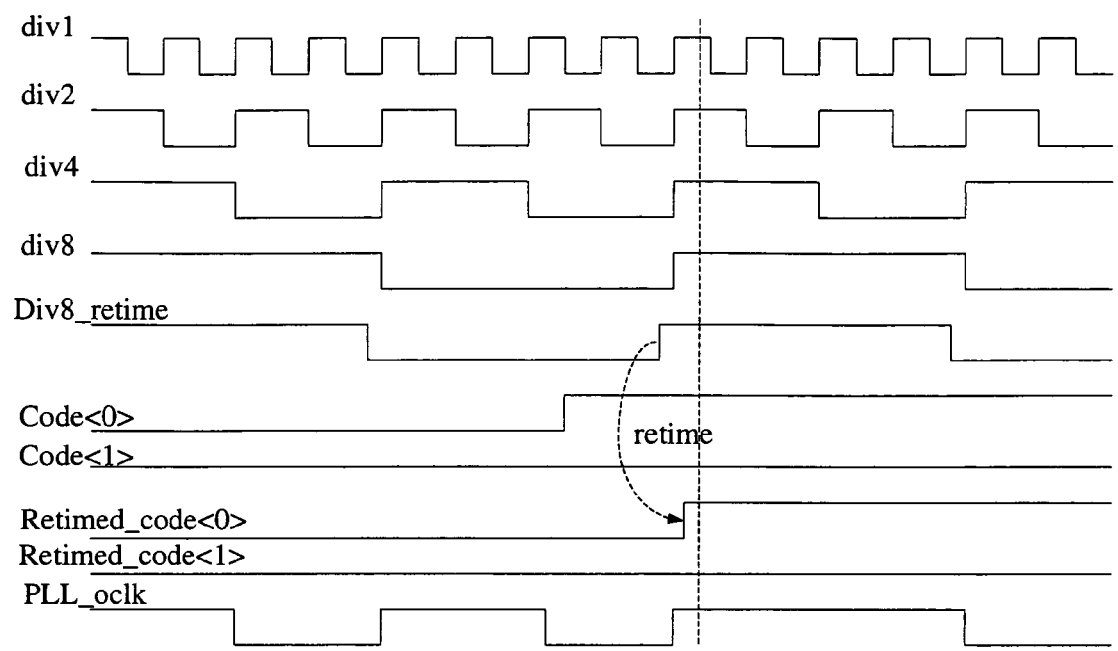
FIG. 8 shows a timing chart of a calibration divider such as that illustrated in FIG. 7.

FIG. 8 illustrates the timing of the embodiment of calibration divider 150 shown in FIG. 7. The clock signals div1, div2, div4, and div8 are all synchronized at the highest frequency clock signal div1. Every eighth high frequency clock period, the four divided signals transition from low to high simultaneously. If the two switch signals (code<1:0>) are active at that time, the four clock signals can be switched, one to the other, smoothly. In order to force the divider code (code<1:0>) to be active during this half period, the divider code should be retimed by the lowest frequency clock (div8), as is shown in FIG. 8. Divider code Code<1:0> can change at any time, but is synchronized at the rising edge of div8 signal by retime code 707 of FIG. 7. Therefore, multiplexer 706 is controlled by the retimed code signal Retimed_code<1:0>. There may be delay in the logic circuits of mux 706 in decoding the retimed code signals Retimed_code<1:0>. However, in some embodiments clock buffers can be inserted to balance the delay. Because the input clock is forced to low frequency at every re-calibration time, the timing is not critical. As shown in FIG. 8, when the output clock signal PLL_oclk is transitioned to a new divisor (e.g., the retimed code changes from "10" to "11"), all of the clock signals div1, div2, div4, and div8 are transitioning, resulting in a glitch free divisor transition.

Therefore, some embodiments of PLL 100 according to the present invention can provide a clean clock without glitch or overshoot during the whole calibration process. Therefore, systems that require a clean clock at all times can safely utilizes some embodiments of PLL 100.

For illustrative purposes, embodiments of the invention have been specifically described above. This disclosure is not intended to be limiting. Therefore, the invention is limited only by the following claims.

What is claimed is:

1. A method of calibrating a phase-locked loop (PLL), comprising:
   forcing a control voltage that is input to a voltage controlled oscillator to be a reference voltage;
   setting a calibration divider that is coupled to receive an output clock signal from the voltage controlled oscillator to a low division divisor, the low division divisor being one of a plurality of divisors;
   allowing the control voltage to be adjusted until the PLL stabilizes;
   comparing the adjusted control voltage to the reference voltage; and
   adjusting the calibration divider to utilize another of the plurality of divisors when a completion condition is not met.

2. The method of claim 1, wherein the completion condition includes that the control voltage exceeds the reference voltage.

3. The method of claim 2, wherein the completion condition includes that the divider code has been adjusted such that all divisors in the calibration divider have been tested.

4. The method of claim 1, further including continuing adjusting the calibration divider to utilize different ones of the plurality of divisors until the completion condition is met.

5. The method of claim 1, wherein adjusting the calibration divider includes
   generating a divisor clock signal in each of the plurality of divisors;
   receiving a divider code that identifies a chosen divisor from the plurality of divisors; and outputting the divisor clock signal of the chosen divisor when all of the divisor clock signals in each of the plurality of divisors are transitioning.

6. The method of claim 1, wherein detecting the need for calibration includes detecting a reset signal.

7. The method of claim 1, wherein detecting the need for calibration includes detecting when a frequency of a reference clock signal has substantially changed from the frequency of a feedback clock signal generated by a feedback loop coupled to receive a PLL output clock signal from the calibration divider.

8. A phase-locked loop (PLL), comprising:
a voltage controlled oscillator that generates an output clock signal in response to a control voltage;
a controller that generates the control voltage in response to a phase difference between a reference clock signal and a feedback clock signal;
a feedback circuit that generates the feedback clock signal in response to a PLL output clock signal;
a calibration divider that includes a plurality of divisors, the calibration divider coupled to receive the output clock signal and to generate the PLL output clock signal in response to a divider code that determines which of the plurality of divisors to utilize;
a reference voltage regulator coupled to receive a reference voltage and to force the control voltage to the reference voltage upon receipt of a force signal; and
a calibration circuit coupled to provide the force signal to the reference voltage regulator and the divider code to the calibration divider.

9. The PLL of claim 8, wherein the controller includes
a phase detection circuit that compares the feedback clock signal with the reference clock signal and provides a comparison signal; and
a charge pump that generates the control voltage in response to the comparison signal.

10. The PLL of claim 8, wherein the feedback circuit includes a feedback divider coupled to receive the PLL output clock signal from the calibration divider and provide the feedback clock signal to the controller.

11. The PLL of claim 8, further including a comparator that asserts an above_VREF signal when the control voltage exceeds the reference voltage.

12. The PLL of claim 11, wherein the calibration circuit initiates a calibration process by first asserting a first signal and then setting the divider code to select one of the plurality of divisors that results in the output clock signal having a high frequency.

13. The PLL of claim 12, wherein the calibration circuit calibrates the PLL by cycling through the divider code to choose each of the plurality of divisors in turn until a completion condition is met.

14. The PLL of claim 13, wherein the completion condition includes assertion of the above-VREF signal.

15. The PLL of claim 13, wherein the completion condition includes that all of the plurality of divisors have been tested.

16. The PLL of claim 12, wherein the calibration circuit initiates the calibration process upon receipt of a reset signal.

17. The PLL of claim 12, wherein the calibration circuit initiates the calibration process when a frequency of the reference clock signal shifts so that it no longer matches a frequency of the feedback clock signal.

18. The PLL of claim 8, wherein the calibration divider further includes
a multiplexer that receives a divided clock signal from each of the plurality of divisors, the divided clock signal being the output clock signal frequency divided by an integer amount according to the corresponding one of the plurality of divisors;
a retime circuit that, upon receipt of a new divider code, switches the multiplexer to the divided clock signal corresponding to the new divider code on the rising edge of the divided clock signal with lowest frequency.

* * * * *